United States Patent [19]

Nagahata

[11] Patent Number: 5,657,067
[45] Date of Patent: Aug. 12, 1997

[54] PRINTER DRIVE IC AND PRINTHEAD USING THE SAME

[75] Inventor: Takaya Nagahata, Kyoto, Japan

[73] Assignee: Rohm Co. Ltd., Kyoto, Japan

[21] Appl. No.: 640,878

[22] PCT Filed: Sep. 29, 1995

[86] PCT No.: PCT/JP95/02009

§ 371 Date: May 16, 1996

§ 102(e) Date: May 16, 1996

[87] PCT Pub. No.: WO96/11109

PCT Pub. Date: Apr. 18, 1996

[30] Foreign Application Priority Data

Oct. 6, 1994 [JP] Japan ................... 6-281095

[51] Int. Cl.⁶ ............................................ B41J 2/345
[52] U.S. Cl. .............................................. 347/209
[58] Field of Search ............................ 347/209, 210, 347/200, 201

[56] References Cited

U.S. PATENT DOCUMENTS

| | | | |
|---|---|---|---|
| 4,651,164 | 3/1987 | Abe et al. ................... | 346/76 |
| 4,764,659 | 8/1988 | Minami et al. .............. | 347/209 |
| 5,097,271 | 3/1992 | Lee et al. ................... | 347/209 |
| 5,335,002 | 8/1994 | Nagahata et al. ........... | 347/209 |
| 5,532,723 | 7/1996 | Nagahata et al. ........... | 347/209 |

FOREIGN PATENT DOCUMENTS

| | | | |
|---|---|---|---|
| 62-92865 | 4/1987 | Japan ..................... | B41J 3/20 |
| 62-191161 | 8/1987 | Japan ..................... | B41J 3/20 |
| 63-56466 | 3/1988 | Japan ..................... | B41J 3/20 |
| 4-14468 | 1/1992 | Japan ..................... | B41J 2/345 |
| 5-301366 | 11/1993 | Japan ..................... | B41J 2/345 |
| 2 252 678 | 8/1992 | United Kingdom .......... | B41J 2/345 |

OTHER PUBLICATIONS

English Abstract of Japanese Utility Model Application No. 62-92865.
English Abstract of Japanese Utility Model Application No. 62-191161.

Primary Examiner—Huan H. Tran
Attorney, Agent, or Firm—Michael D. Bednarek; Kilpatrick Stockton LLP

[57] ABSTRACT

A printer drive IC (5) of the present invention is generally rectangular as viewed from above, and includes a first longitudinal edge (5a) closer to a recording element of the printer and a second longitudinal edge (5b) opposite to the first longitudinal edge. The drive IC (5) includes a plurality of output pads (11), a drive section (12) which includes drive circuits connected to the output pads (11) for driving the recording element of the printer, and a signal processing section (15) including a logic circuit section in which logic circuits are provided for processing input signals and controlling the drive section (14). The output pads, the drive section and the signal processing section are disposed generally in parallel to the first longitudinal edge (5a) and in the mentioned order from the first longitudinal edge (5a) toward the second longitudinal edge (5b). The drive IC (5) further includes a plurality of signal pads (12) connected to the signal processing section (15) for receiving input signals, and a plurality of power pads (13) connected to the signal processing section (15) and the drive section (12) for input of power supply. The signal pads and the power pads are arranged closer to the first longitudinal edge (5a) than the logic circuit section of the signal processing section (15).

5 Claims, 5 Drawing Sheets

PRINTER DRIVE IC AND PRINTHEAD USING THE SAME

TECHNICAL FIELD

The present invention relates to a drive IC for driving a recording element, such as a heating element, of a printhead which is used as a recording device for a facsimile machine, other office automation machine or the like. The present invention also relates to a printhead using such a drive IC.

BACKGROUND ART

FIG. 7 shows a structure of a thermal head as an example of a printhead which is used as a recording device for a facsimile machine, other office automation machine or the like, wherein a heating resistor is selectively heated to thermally cause a thermosensitive paper, which is fed in contact with the thermal head, to make a change in color for recording. Specifically, a printhead substrate 51 made of alumina ceramic for example is formed with a linear heating resistor 52, a common electrode 53 including comb-like teeth each having a tip in contact with the heating resistor 52, and a multiplicity of individual electrodes 54 each having one end in contact with the heating resistor 52 between adjacent teeth of the common electrode 53. Further, the printhead substrate 51 carries a plurality of drive ICs 55 attached thereon by die bonding. The drive ICs 55 are wire-bonded to the individual electrodes 52 each at the other end thereof while also wire-bonded to a multiplicity of conductive connecting portions 57 formed on a printed circuit board 56.

As shown in FIG. 8, a conventional drive IC 55 for driving a recording element, such as a heating resistor 52, of a printer is generally rectangular as viewed from above, and has a pair of longitudinal edges 55a, 55b. A multiplicity of output pads 61 are disposed in a staggered arrangement along one of the paired longitudinal edges 5a, 5b, that is, the longitudinal edge 55a (hereinafter referred to as "first longitudinal edge") which is closer to the heating resistor 52. Each of the output pads 61 is wire-bonded to the above-mentioned other end of a respective individual electrode 5a. The drive IC 55 is provided with a multiplicity of signal pads 62 and power pads 63 which are arranged along the other longitudinal edge, that is, the longitudinal edge 55b (hereinafter referred to as "second longitudinal edge") which is closer to the printed circuit board 56. The signal pads 62 and the power pads 63 are wire-bonded to the connecting portions 57. The drive IC 55 has a drive section 64 and a signal processing section 65 disposed between the output pads 61 and the signal pads 62 or the power pads 63. The drive section 64 is closer to the first longitudinal edge 55a than the signal processing section 65. The drive section 64 is connected to the output pads 61 via wirings and includes a circuit for turning on and off an electrical current passing through the portions of the heating resistor 52 located between the individual electrodes 54 and the teeth of the common electrode 53. The signal processing section 65 is connected to the signal pads 62 by wirings and includes logic circuits as well as a shift register for controlling the drive section 62 by processing the signals which are fed externally via the connecting portions 57.

With such an arrangement, when wire-bonding the signal pads 62 and power pads 63 along the second longitudinal edge 55b of the drive IC 55 to the connecting portions 57 on the printed circuit board 56, it is necessary to cause a flat portion of the upper surface of the printhead substrate 51 to be located under the signal pads 62 and the power pads 63 for bonding wires. To this end, conventionally, the drive IC 55 is die-bonded to the printhead substrate 51 in a manner such that the second longitudinal edge 55b of the drive IC 55 positionally deviates slightly inward from an edge of the printhead substrate 51, thereby ensuring that the signal pads 62 and the power pads 63 are located above the flat portion of the upper surface of the printhead substrate 51. Since a respective printhead substrate 51 is obtained by dividing a master substrate formed with multiple printhead substrates 51 along cutting lines, corners of the above-mentioned edge of the printhead substrate may be often damaged during the dividing process, thereby failing to make the upper surface of the printhead substrates 51 to be a complete plane due to the presence of a chipped portion extending for a certain width from the edge. Thus, when the drive IC 55 is die-bonded onto the printhead substrate 51 in a manner such that the second longitudinal edge 55b of the drive IC 55 positionally corresponds to the edge of the printhead substrate 51, the lower surface of the drive IC 55 is to face the incomplete plane of the upper surface of the printhead substrate 51. As a result, the drive IC 55 may be damaged or come off from the printhead substrate 51 due to a shock caused by the wire-bonding at the signal pads 62 and the power pads 63. It is for prevention of such problems that the second longitudinal edge 55b of the drive IC 55 is arranged to positionally deviate inwardly from the edge of the printed substrate 51 by a predetermined amount. Further, when the second longitudinal edge 55b of the drive IC 55 is arranged to positionally deviate inwardly from the edge of the printhead substrate 51, setting the amount of deviation at a rather larger value can make it unnecessary to strictly require accurate positioning of the die-bonding for the drive IC 55, thereby facilitating the die-bonding process.

Recently, since reduction in size and power of recording devices using printhead substrates 51 has been promoted at a fast pace, it is urgently desired to make smaller printhead substrates 51. However, since the second longitudinal edge 55b of the drive IC 55 is arranged to positionally deviate inwardly from the edge of the printhead substrate 51 because of the reasons described above, the length of the shorter edges of the printhead substrate 51 is wastefully made large correspondingly to the amount of the deviation, thereby hindering the reduction in size of the printhead substrate 51.

DISCLOSURE OF THE INVENTION

Therefore, an object of the present invention is to provide a printer drive IC which, without suffering any problems such as a damage or coming off during the wire-bonding process at signal pads and power pads, enables reduction in size of a printhead substrate.

Another object of the present invention is to provide a printhead wherein a printhead substrate and a printed circuit board can be firmly attached to each other by hard coat when the printer drive ICs are arranged to deviate outwardly from an edge of the printhead substrate.

According to a first aspect of the present invention, there is provided a drive IC for driving a recording element of a printer, the drive IC being generally quadrilateral as viewed from above, the drive IC comprising a first edge which is directed toward the recording element of the printer and a second edge opposite to the first edge, the drive IC further comprising in the successive order from the first edge toward the second edge: a region for arranging output pads; a region for arranging a drive section for driving the recording element of the printer; and a region for arranging a signal processing section which includes a logic circuit section and a register section to process input signals for output to the drive section; wherein the drive IC also comprises signal pads and power pads which are arranged closer to the first edge than the region for arranging the logic circuit section of the signal processing section.

In the printer drive IC described above, since the signal pads and the power pads are arranged closer to the first edge than the region for arranging the logic circuit section of the signal processing section, the signal pads and the power pads are to be disposed above a flat portion which is located inwardly from a damaged portionaat an edge of the upper surface of the printhead substrate even when the second edge of the drive IC is arranged to positionally correspond to the above-mentioned edge of the printhead substrate or arranged to project slightly outward from the same edge thereof. As a result, the drive IC can be prevented from suffering a damage or coming off from the printhead substrate during the wire bonding at the signal pads and the power pads.

According to a second aspect of the present invention, there is provided a drive IC for driving a recording element of a printer, the drive IC being generally quadrilateral as viewed from above, the drive IC comprising a first edge which is directed toward the recording element of the printer and a second edge opposite to the first edge, the drive IC further comprising: output pads arranged along the first edge; and signal pads and power pads which are spaced from the second edge by no less than 150 µm.

In the printer drive IC having the above structure, since the signal pads and the power pads are spaced from the second edge by no less than 150 µm, the signal pads and the power pads are to be disposed above a flat portion which is located inwardly from a damaged portion at an edge of the upper surface of the printhead substrate even when the second edge of the drive IC is arranged to positionally correspond to the above-mentioned edge of the printhead substrate or arranged to project slightly outward from the same edge thereof. As a result, the drive IC can be prevented from suffering a damage or coming off from the printhead substrate during the wire bonding at the signal pads and the power pads. The damaged portion at the above-mentioned edge of the upper surface of the printhead substrate extend only for a width of no more than 150 µm from the same edge thereof. Therefore, by arranging the signal pads and the power pads to be spaced from the second edge of the drive IC by no less than 150 µm, the signal pads and the power pads can be prevented from being located above the damaged portion of the upper surface of the printhead substrate even when the second edge of the drive IC is arranged to positionally correspond to the above-mentioned edge of the printhead substrate or arranged to project slightly outward from the same edge thereof. Further, since the width of the logic circuit section of the signal processing section of the drive IC is approximately 150 µm, it is possible to dispose the logic circuit section of the signal processing section between the signal and power pads and the second edge of the drive IC.

According to a third aspect of the present invention, there is provided a drive IC for driving a recording element of a printer, the drive IC being generally rectangular as viewed from above, the drive IC comprising a first longitudinal edge which is directed toward the recording element of the printer and a second longitudinal edge opposite to the first longitudinal edge, the drive IC further comprising in the successive order from the first longitudinal edge toward the second longitudinal edge: a plurality of output pads; a drive section which includes drive circuits connected to the output pads for driving the recording element of the printer; and a signal processing section which includes a logic circuit section for processing input signals and controlling the drive section, the logic circuit section including logic circuits; wherein the drive IC also comprises a plurality of signal pads connected to the signal processing section for receiving input signals, and a plurality of power pads connected to the signal processing section and the drive section for input of power supply, the signal pads and the power pads being arranged closer to the first longitudinal edge than the logic circuit section of the signal processing section.

In the printer drive IC described above, since the signal pads and the power pads are arranged closer to the first longitudinal edge than the logic circuit section of the signal processing section, the signal pads and the power pads are to be disposed above a flat portion which is located inwardly from a damaged portion at an edge of the upper surface of the printhead substrate even when the second edge of the drive IC is arranged to positionally correspond to the above-mentioned edge of the upper surface of the printhead substrate or arranged to project slightly outward from the same edge thereof. As a result, the drive IC can be prevented from suffering a damage or coming off from the printhead substrate during the wire bonding at the signal pads and the power pads. Further, since the logic circuit section of the signal processing section is arranged closer to the second longitudinal edge than the signal pads and the power pads, the shorter edges of the drive IC can be prevented from becoming large in dimension.

According to a preferred embodiment of the present invention, at least either of the signal pads and the power pads is disposed between the signal processing section and the drive section.

According to another preferred embodiment of the present invention, at least either of the signal pads and the power pads is disposed between the drive section and the output pads.

According to another preferred embodiment of the present invention, the signal processing section includes a logic circuit section and a register section which is provided with a shift register and a latch circuit for processing input signals and controlling the drive section, wherein the register section is arranged closer to the first longitudinal edge than the logic circuit section, and the signal pads and the power pads are disposed between the logic circuit section and the register section.

According to another preferred embodiment of the present invention, the signal pads and/or the power pads are arranged closer to the first longitudinal edge than the logic circuit section of the signal processing section and along either or both of the shorter edges.

According to a fourth aspect of the present invention, there is provided a drive IC for driving a recording element of a printer, the drive IC being generally rectangular as viewed from above, the drive IC comprising a first longitudinal edge which is closer to the recording element of the printer and a second longitudinal edge opposite to the first longitudinal edge, the drive IC further comprising: a plurality of output pads arranged along the first longitudinal edge; wherein a plurality of signal pads connected to a signal processing section for receiving input signals as well as a plurality of power pads connected to the signal processing section and a drive section for input of power supply are spaced from the second longitudinal edge by no less than 150 µm.

The above drive IC has advantages substantially similar to those described for the second aspect of the present invention.

For more effective utilization of of the advantages of the present invention, the signal pads and the power pads may be spaced from the second longitudinal edge by no less than 250 μm. Thus, since the width of the signal processing section of the drive IC is approximately 250 μm, the signal processing section can be disposed between the signal and power pads and the second longitudinal edge of the drive IC.

Alternatively, the signal pads and the power pads may be spaced from the second longitudinal edge by no less than 600 μm. Thus, since the signal processing section of the drive IC has a width of approximately 250 μm and the drive section has a width of approximately 350 μm, both of the signal processing section and the drive section can be disposed between the signal and power pads and the second longitudinal edge of the drive IC.

According to a fifth aspect of the present invention, there is provided a printhead comprising: a printhead substrate which is generally rectangular as viewed from above, the substrate including a recording element and a drive IC for driving the recording element; and a printed circuit board for supplying signals and power to the drive IC; wherein the drive IC is generally quadrilateral as viewed from above, the drive IC having a first edge which is closer to the recording element and a second edge opposite to the first edge, the drive IC further having output pads, signal pads and power pads, the output pads being arranged along the first edge, the signal pads and the power pads being spaced from the second edge by no less than 150 μm; wherein the printed circuit board and the printhead substrate are arranged in a manner such that an edge of the printhead substrate and an edge of the printed circuit board face each other with a predetermined spacing; and wherein the second edge of the drive IC protrudes from said edge of the printhead substrate by a predetermined amount.

Various features and advantages of the present invention will become apparent from the following description of the embodiments given with reference to the accompanying drawings.

BEST MODE FOR CARRYING OUT THE INVENTION

A preferred embodiment of the present invention will be described below with reference to FIGS. 1–6.

Figure 1:
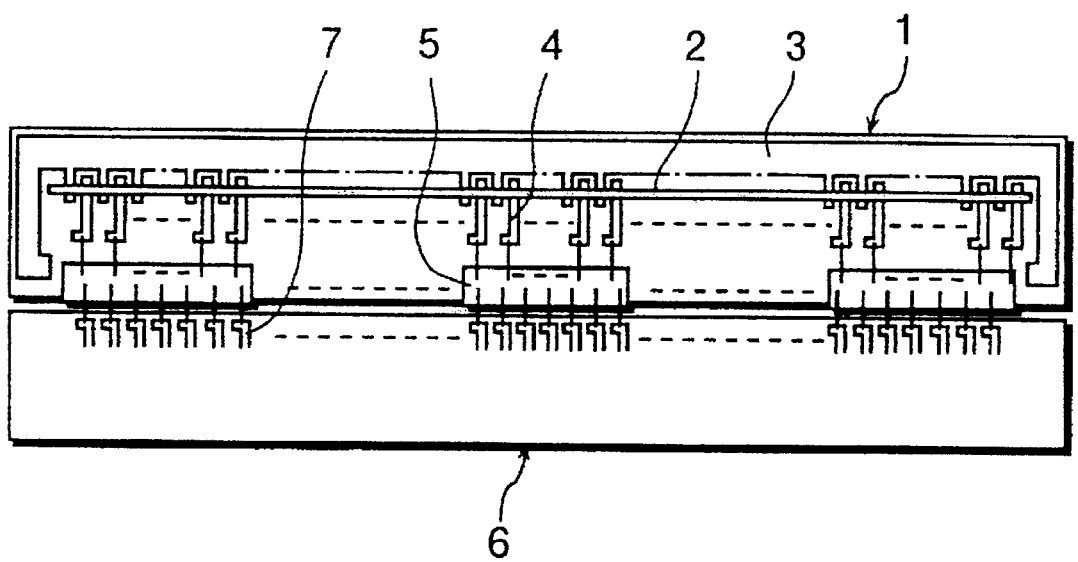
FIG. 1 is a plan view schematically showing a printhead provided with printer drive ICs according to an embodiment of the present invention.

FIG. 1 is a schematic plan view showing a printhead provided with printer drive ICs embodying the present invention. A printhead substrate 1 made of alumina ceramic for example is formed with a linear heating resistor 2, a common electrode 3 including comb-like teeth each having a tip in contact with the heating resistor 2, and a multiplicity of individual electrodes 4 each having one end in contact with the heating resistor 2 between adjacent teeth of the common electrode 3. Further, the printhead substrate 1 is provided with a plurality of drive ICs 5 fixed thereon by die bonding. The drive ICs 5 are wire-bonded to the individual electrodes 4 each at the other end thereof while also wire-bonded to a plurality of conductive connecting terminals 7 which are formed on a printed circuit board 6.

Figure 2:
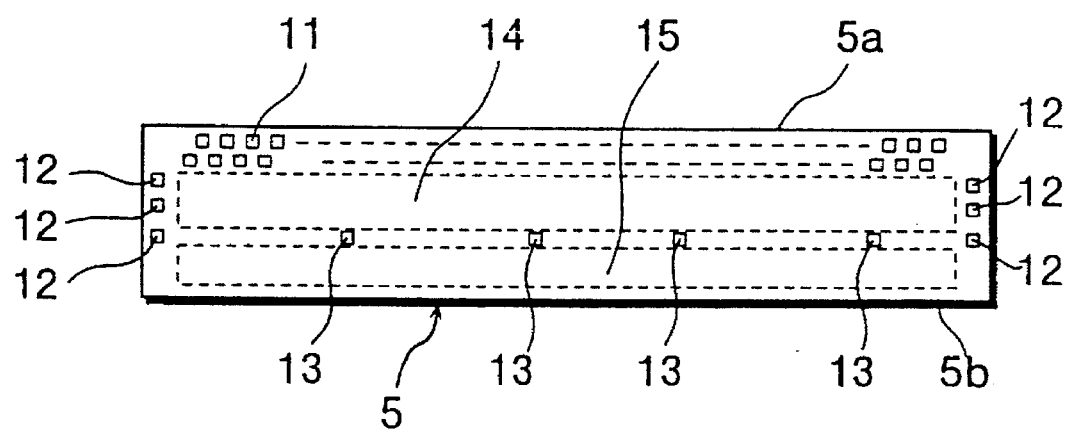
FIG. 2 is a plan view schematically showing each printer drives IC embodying the present invention.

FIG. 2 is a schematic plan view illustrating a pad arrangement of each printer drive IC embodying the present invention. The drive IC 5 is generally rectangular as viewed from above, and has a pair of longitudinal edges 5a, 5b. A plurality of output pads 11 are disposed in a staggered arrangement along one of the paired longitudinal edges 5a, 5b, that is, the longitudinal edge 5a (hereinafter referred to as "first longitudinal edge") which is closer to the heating resistor 2. Each of the output pads 11 is wire-bonded to said other end of a respective individual electrode 4. The drive IC 5 is provided with a plurality of signal pads 12 which are arranged along the shorter edges and spaced from the other longitudinal edge 5b (hereinafter referred to as "second longitudinal edge") by at least 150 μm. The drive IC 5 is also provided with a plurality of power pads 13 which are arranged in parallel to the second longitudinal edge 5b and spaced therefrom by at least 150 μm. The signal pads 12 and the power pads 13 are wire-bonded to the connecting terminals 7 on the printed circuit board 6. The drive IC 5 has a drive section 14 disposed between the output pads 11 and the power pads 13, and a signal processing section 15 disposed between the power pads 13 and the second longitudinal edge 5b of the drive IC 5. The drive section 14 is connected to the output pads 41 via wirings and includes a circuit for turning on and off an electrical current passing through the portions of the heating resistor 2 located between the individual electrodes 4 and the teeth of the common electrode 3. The signal processing section 15 is connected to the signal pads 12 by wirings and includes a logic circuit section as well as a register section for controlling the drive section 12 by processing the signals which are fed externally via the connecting terminals 7 on the printed circuit board 6.

The output pads 11 are disposed in a region of about 200 μm width which includes the first longitudinal edge 5a of the drive IC 5. The drive section 12 is disposed in a region of about 350 μm width which is adjacent to the region of the output pads 11. The power pads 13 are disposed in a region of about 150 μm width which is adjacent to the region of the drive section 14. The signal processing section 15 is disposed in a region of about 250 μm width which is adjacent to the region of the power pads 13 and includes the second longitudinal edge 5b of the drive IC 5. The logic circuit section of the signal processing section 15 is disposed in a region of about 150 μm width which is adjacent to the region of the power pads 13, whereas the register portion of the signal processing section 15 is disposed in a region of about 100 μm width which includes the second longitudinal edge 5b of the drive IC 5. Thus, in the illustrated embodiment, each shorter edges of the drive IC 5 is approximately 0.95 mm (950 μm), and the signal pads 12 and the power pads 13 are spaced from the second longitudinal edge 5b of the drive IC 5 by no less than approximately 250 μm. The thickness of the drive IC 5 is approximately 0.35 mm.

Figure 3:
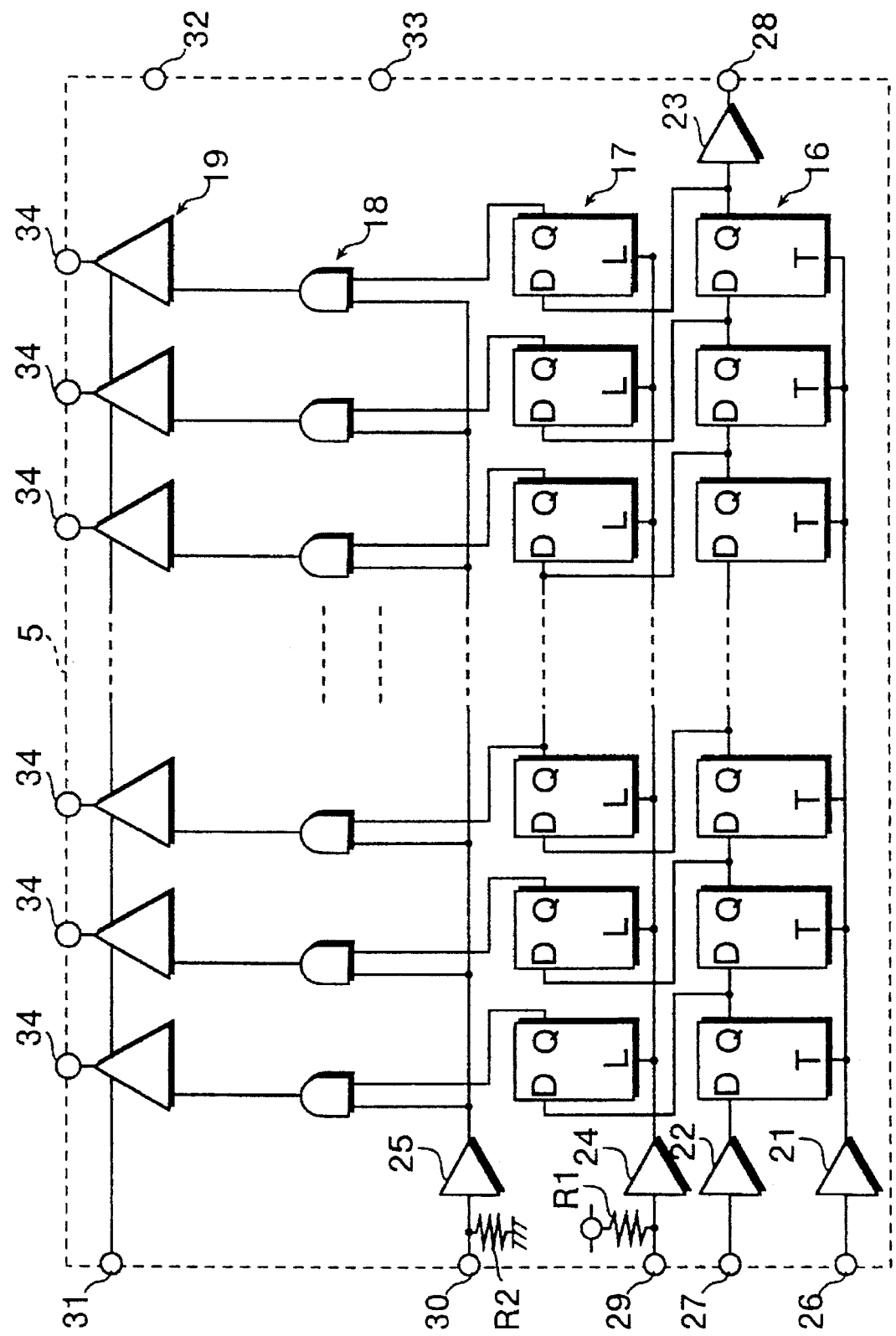
FIG. 3 is a circuit block diagram of the printer drive IC embodying the present invention.

FIG. 3 is a circuit block diagram of the printer drive IC embodying the present invention. The drive IC 5 comprises a shift register 16 consisting of multiple D flip-flops, a latch circuit 17 consisting of multiple D flip-flops, multiple AND circuits 18, and multiple output circuits 19. The D flip-flops constituting the shift register 16, the D flip-flops constituting the latch circuit 17, the AND circuits 18, the output circuits 19 and the inverters 20 are equal in number to the dots corresponding to one drive IC 5. Further, the drive IC 5 comprises a clock signal input circuit 21, a serial data input circuit 22, a serial data output circuit 23, a latch pulse input circuit 22, a strobe signal input circuit 25, a clock signal input terminal 26, a serial data input terminal 27, a serial data output terminal 28, a latch pulse input terminal 29, a strobe signal input terminal 30, a driving voltage input terminal 31, a power input terminal 32, a grounding terminal 33, a multiple output terminals 34, and resistors R1, R2. The output terminals 34 are equal in number to the output circuits 19.

In the drive IC 5, driving data serially fed to the shift register 16 are latched by the latch circuit 17. When a strobe signal is fed to the AND circuits 18 via the strobe signal input terminal 30, the latched data are fed to the output circuits 19 via the AND circuits 18. As a result, the output circuits 19 corresponding to those dots to be turned on by the driving data cause a driving voltage supplied via the driving voltage input terminal 31 to be fed to the corresponding output terminals 34. Since the output terminals 34 are connected to the output pads 11, an electric current will pass through the corresponding individual electrodes 4, the heating resistor 2 and the common electrode 3 to heat the corresponding portions of the heating resistor 2.

The output circuits 19 of the drive IC 5 constitute the drive section 14, whereas the other circuits constitute the signal processing section 15. The shift register 16 and latch circuit 17 of the signal processing section 15 constitute the register section, whereas the other circuits thereof constitute the logic circuit section.

Figure 4:
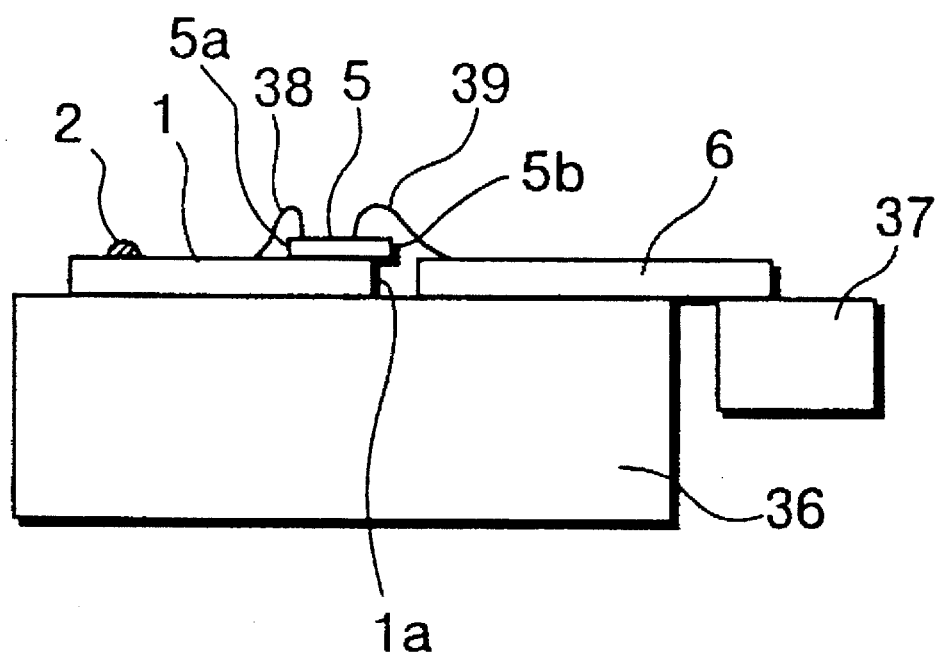
FIG. 4 is a side view schematically showing the same printhead incorporating the printer drive ICs embodying the present invention.

FIG. 4 is a schematic side view of the printhead provided with the printer drive ICs embodying the present invention. The printhead substrate 1 and the printed circuit board 6 are disposed on a heat sink plate 36 made of aluminum for example, whereas the printed circuit board 6 is provided with a detachable connector 37. The output pads 11 of the drive ICs 5 and the individual electrodes 4 on the printhead substrate 1 are connected to each other by wires 38 made of e.g. gold, whereas the signal pads 12 and power pads 13 of the drive ICs 5 are connected to the connecting terminals 7 on the printed circuit board board 6 by wires 39 made of e.g. gold. The second longitudinal edge 5b of each drive IC 5 protrudes slightly outward from a longitudinal edge 1a of the printhead substrate 1. The shorter edges of the printhead substrate 1 are approximately 5–7.8 mm long.

In this way, since the signal pads 12 and power pads 13 of the drive IC 5 are spaced from the second longitudinal edge 5b of the drive IC 5 by at least 150 μm, the signal pads 12 and the power pads 13 can be located sufficiently inward away from the longitudinal edge of the printhead substrate 1 even when the second longitudinal edge 5b of the drive IC 5 is made to protrude slightly outward from the longitudinal edge of the printhead substrate 1. As a result, when the wires 19 are bonded to the signal pads 12 and the power pads 13, the drive IC 5 does not suffer any damage nor come off. Therefore, the shorter edges of the printhead substrate 1 can be reduced in length, thereby enabling a size reduction of the printhead.

Further, since the power pads 13 are disposed between the drive section 14 and the signal processing section 15, the length of the wiring pattern for power supply can smaller than if the power pads are arranged along the second longitudinal edge 5b of the drive IC 5, thereby reducing the power loss caused by the resistance of the wiring pattern.

Still further, since the signal processing section 15 is disposed between the second longitudinal edge 5b of the drive IC 5 and the power pads 13, the spacing between the second longitudinal edge 5b of the drive IC 5 and the power pads 13 can be as much as 250 μm without providing any additional region for the drive IC 5, i.e., without increasing the length of the shorter edges of the drive IC 5. Therefore, the second longitudinal edge 5b of the drive IC 5 can be rendered to protrude to a greater extent, the printhead substrate 1 can be further reduced in size.

Figure 5:
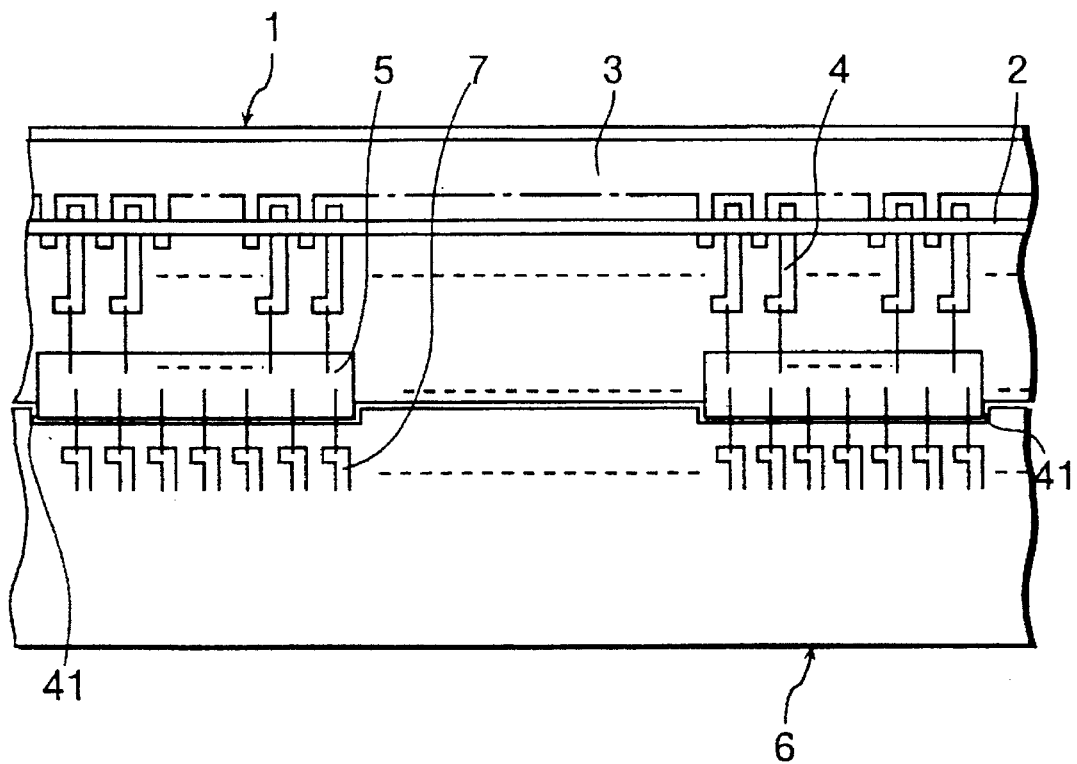
FIG. 5 is an enlarged plan view of a principal part of another printhead embodying the present invention.
Figure 6:
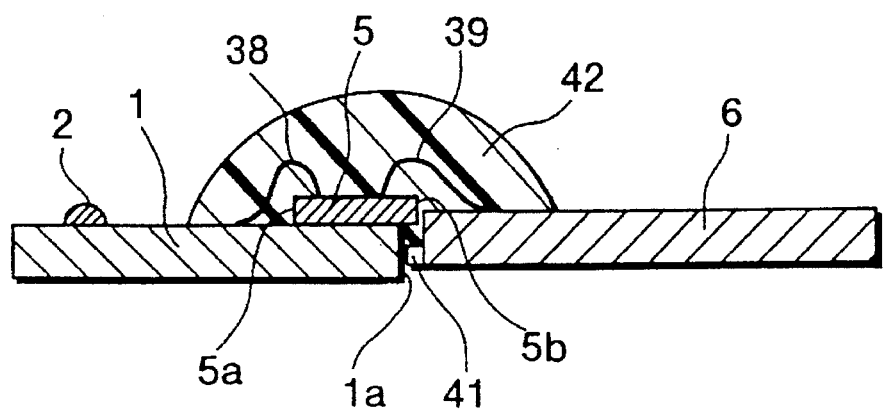
FIG. 6 is an enlarged side view, in vertical section, illustrating the principal part of the same printhead embodying the present invention.
Figure 7:
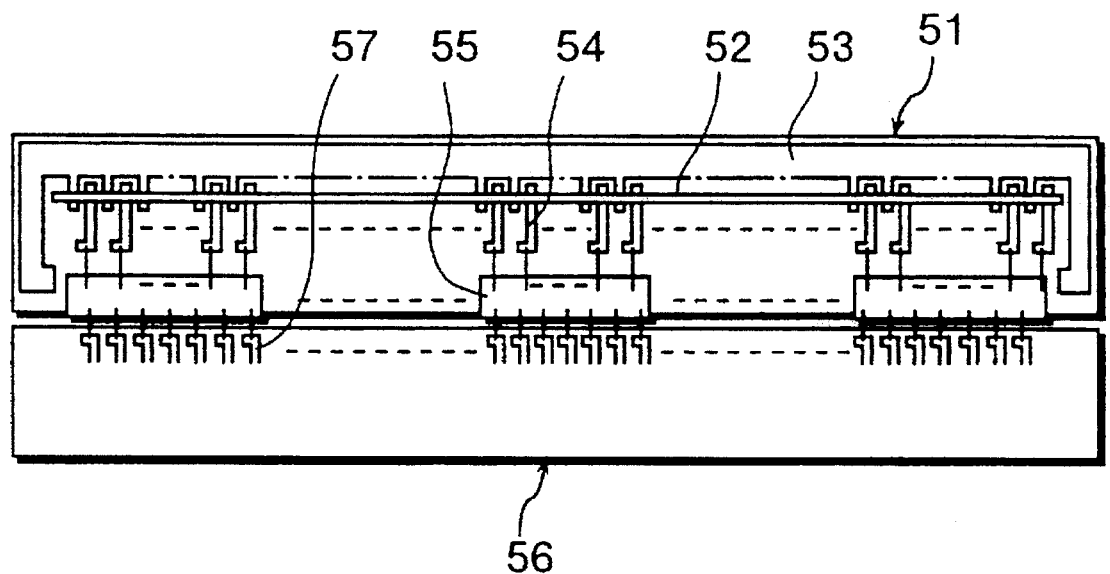
FIG. 7 is a plan view schematically showing a printhead provided with prior art printer drive ICs.
Figure 8:
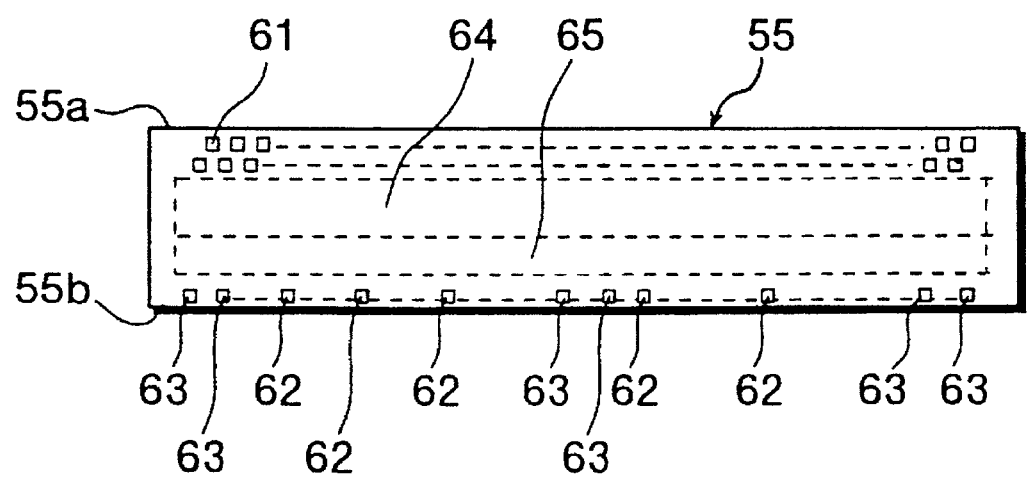
FIG. 8 is a schematic plan view showing one of the prior art printer drives IC.

The printed circuit board 6 and the printhead substrate 1 may be arranged in the manner shown in FIG. 5 and 6. The upper surface of the printed circuit board 6 is disposed higher than the upper surface of the printhead substrate 1, and an edge of the printhead substrate 1 is held in facing relation to an edge of the printed circuit board 6 with a predetermined spacing therebetween. The second longitudinal edge 5a of each of the drive ICs 5 is rendered to protrude from the above-mentioned edge of the printhead substrate 1 by a predetermined amount, and the above-mentioned edge of the printed circuit board 6 is formed with cutouts 41 each of which corresponds to a portion of a respective drive IC 5 projecting from the above-mentioned edge of the printhead substrate 1.

Due to the formation of the cutouts 41 on the printed circuit board 6, even when the second longitudinal edge 5b of each drive IC 5 is rendered to project from the above-mentioned edge of the printhead substrate 1 by a predetermined amount, the projecting portion can be accommodated in a respective cutout 41. Thus, the upper surface of the printed circuit board 6 can be located higher than the upper surface of the printhead substrate 1 while keeping a predetermined spacing between the above-mentioned edge of the printhead substrate 1 and the above-mentioned edge of the printed circuit board 6. As a result, it is possible to reduce the length of the wires 39 used for bonding the signal pads 12 and power pads 13 of the drive IC 5 to the connecting terminals 7 on the printed circuit board 6, thereby saving wire consumption. Further, since the respective upper surfaces of the printed circuit board 6 and printhead substrate 1 are arranged at different heights, a hard coating material 42 applied to the upper surfaces of the printed circuit board 6 and printhead substrate 1 for covering the drive IC 5 and the wires 38, 39 can properly flow into the clearances between the printed circuit board 6 and the printhead substrate 1 or the drive IC 5, so that the printed circuit board 6 and the printhead substrate 1 can be firmly attached to each other by the hard coating material 42.

According to the foregoing embodiments, the signal pads 12 and the power pads 13 are arranged separately. However, these pads may be disposed in a mixed arrangement. Specifically, the signal pads 12 and the power pads 13 may be arranged to coexist in each of the respective regions where the signal pads 12 and the power pads 13 are separately disposed in the above embodiments. Further, the signal pads 12 and the power pads 13 can be arranged to coexist only in the regions where the signal pads 12 are disposed in the above embodiments. Still further, the signal pads 12 and the power pads 13 can be arranged to coexist only in the region where the power pads 13 are disposed in the above embodiments. Still further, the signal pads 12 and/or the power pads 13 can be arranged to coexist only in either of the two regions where the signal pads 12 are disposed in the above embodiments.

In the foregoing embodiments, the power pads 13 are disposed between the region for the drive section 14 and the region for the signal processing section 15. However, it is also possible to dispose the region for the drive section 12 to be adjacent to that for the signal processing section 15 while arranging the power pads 13 and/or the signal pads 12 between the region for the drive section 14 and that for the output pads 11. Further, it is possible to exchange the positions of the the register section and the logic circuit section to cause the register section of the signal processing section 15 to be adjacent to the drive section 14 so that the power pads 13 and/or the signal pads 12 are disposed between the register section and the logic circuit section. In this case, only the logic circuit section of the signal processing section 15 is disposed between the power pads 13 and/or the signal pads 12 and the second longitudinal edge 5b of the drive IC 5.

In the above embodiments, the drive ICs 5 are used for the printhead of a thermal printer to control the heating resistor 2 for heating. However, it is also possible to use the drive ICs for the printhead of a laser printer to control the luminance of the laser diodes or LEDs by the drive ICs 5.

INDUSTRIAL APPLICABILITY

A printer drive IC and a printhead according to the present invention may be used for a printer to print letters, symbols, figures or the like.

I claim:

1. A printhead comprising: a printhead substrate which is generally rectangular as viewed from above, the substrate including a recording element and a drive IC for driving the recording element; and a printed circuit board for supplying signals and power to the drive IC;

wherein the drive IC is generally quadrilateral as viewed from above, the drive IC having a first edge which is closer to the recording element and a second edge opposite to the first edge, the drive IC further having output pads, signal pads and power pads, the output pads being arranged along the first edge, the signal pads and the power pads being spaced from the second edge by no less than 150 μm;

wherein the printed circuit board and the printhead substrate are arranged in a manner such that an edge of the printhead substrate and an edge of the printed circuit board face each other with a predetermined spacing; and wherein the second edge of the drive IC protrudes from said edge of the printhead substrate by a predetermined amount.

2. A drive IC for driving a recording element of a printer, the drive IC being generally rectangular with a first longitudinal edge and a second longitudinal edge opposite to the first longitudinal edge, the drive IC comprising:

output pads provided in a region adjacent to the first longitudinal edge;

a drive circuit section connected to the output pads and provided adjacent to the region of the output pads;

a signal processing circuit section connected to the drive circuit section and provided adjacent to the second longitudinal edge, the signal processing circuit section including a logic circuit section and a register section; and power pads connected to the drive circuit section and provided between the signal processing circuit section and the drive circuit section.

3. The drive IC according to claim 2, further comprising signal pads which are provided closer to the first longitudinal edge than the signal processing circuit section.

4. The drive IC according to claim 3, wherein the signal pads and the power pads are spaced from the second longitudinal edge by no less than 150 μm.

5. The drive IC according to claim 3, wherein the signal pads and the power pads are spaced from the second longitudinal edge by no less than 250 μm.

* * * * *